United States Patent
Awad et al.

(10) Patent No.: US 7,071,559 B2
(45) Date of Patent: Jul. 4, 2006

(54) DESIGN OF BEOL PATTERNS TO REDUCE THE STRESSES ON STRUCTURES BELOW CHIP BONDPADS

(75) Inventors: Elie Awad, Essex Junction, VT (US); Mariette A. Awad, Essex Junction, VT (US); Kai D. Feng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 10/710,510

(22) Filed: Jul. 16, 2004

(65) Prior Publication Data

US 2006/0012045 A1    Jan. 19, 2006

(51) Int. Cl.
*H01L 23/48* (2006.01)
*H01L 23/52* (2006.01)
*H01L 29/40* (2006.01)

(52) U.S. Cl. ...................... 257/758; 257/759
(58) Field of Classification Search ................ 257/758, 257/759
See application file for complete search history.

(56) References Cited

U.S. PATENT DOCUMENTS

| | | | |
|---|---|---|---|
| 4,874,722 A | 10/1989 | Bednarz et al. | |
| 5,043,793 A | 8/1991 | Gootzen et al. | |
| 5,250,847 A | 10/1993 | Baskett | |
| 5,834,840 A | 11/1998 | Robbins et al. | |
| 5,866,949 A | 2/1999 | Schueller | |
| 5,990,545 A | 11/1999 | Schueller et al. | |
| 6,197,613 B1 | 3/2001 | Kung et al. | |
| 6,426,545 B1 | 7/2002 | Eichelberger et al. | |
| 6,555,908 B1 | 4/2003 | Eichelberger et al. | |
| 6,559,548 B1 * | 5/2003 | Matsunaga et al. | 257/774 |
| 6,566,244 B1 | 5/2003 | May et al. | |
| 2002/0011656 A1 | 1/2002 | Swanson et al. | |

* cited by examiner

*Primary Examiner*—Tu-Tu Ho
(74) *Attorney, Agent, or Firm*—Gibb I.P. Law Firm, LLC; Anthony Canale (57) ABSTRACT

A semiconductor structure comprising a substrate including a first layer comprising a first material having a first modulus of elasticity; a first structure comprising a conductor and formed within the substrate, the first structure having an upper surface; and a stress diverting structure proximate the first structure and within the first layer, the stress diverting structure providing a low mechanical stress region at the upper surface of the first structure when a physical load is applied to the first structure, wherein said low mechanical stress region comprises stress values below the stress values in areas not protected by the stress diverting structure. The stress diverting structure comprises a second material having a second modulus of elasticity less than the first modulus of elasticity, the second material selectively formed over the upper surface of the first structure for diverting mechanical stress created by the physical load applied to the first structure.

2 Claims, 5 Drawing Sheets

DESIGN OF BEOL PATTERNS TO REDUCE THE STRESSES ON STRUCTURES BELOW CHIP BONDPADS

BACKGROUND OF INVENTION

1. Field of the Invention

The invention generally relates to semiconductor technologies, and more particularly to a mechanical stress diversion under bondpads on semiconductor chips.

2. Description of the Related Art

Conventional techniques for protecting structures on semiconductor chips include the approach described in U.S. Pat. No. 6,495,917 (hereinafter the '917 patent) issued to Ellis-Monaghan, et al. on Dec. 17, 2002, the complete disclosure of which is herein incorporated by referenced. As described in the '917 patent, the use of low dielectric potential (k) interlevel dielectric (ILD) materials (e.g., spin-on-glass (SOG), Hydrogensilsesquioxane (HSQ), Methylisilane (MSQ), Benzocyclobutene (BCB), etc.) has become very popular for input/output (I/O) and mechanical support structures which are applied to a previously fabricated semiconductor chip. Such I/O and support structures are formed after the logical function sections of the semiconductor chip have been completed. Therefore, such structures/processing are sometimes referred to as "back end of line" (BEOL) structures/processing because they are formed at the back end of the production line.

However, many low k materials are brittle or soft as compared to silicon dioxide and, when bonding forces are applied; the low k materials can be easily damaged. More specifically, the forces applied during bonding processes (such as ultrasonic wirebonding) or during the formation of solderball (C4) connections, can damage the low k dielectric materials. Thus, the damage from ultrasonic energy (wirebonding), capillary pressure and temperature can weaken or collapse the low k insulator. Furthermore, the mechanical stresses associated with structures below the chip bondpads are such that a significant build up of these stresses may result in material failure, fatigue, and eventual device breakdown. The stress and strain of a given material are directly proportional to one another and the proportionality in its simplest form is given by the relationship $\sigma = E\epsilon$, where $\sigma$ is the stress of the material, $\epsilon$ is the strain of the material, and $E$ is the modulus of elasticity of the material.

Figure 1:
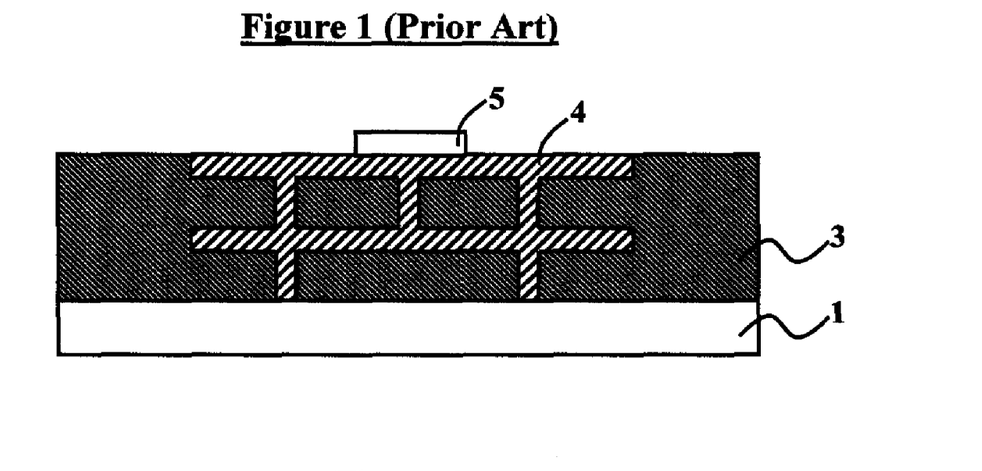
FIG. 1 is a schematic cross-sectional diagram of a conventional semiconductor device.

FIG. 1 illustrates a conventional semiconductor device with support structures. A bulk silicon substrate layer 1 is shown with an oxide layer 3 disposed thereon. Moreover, formed within the oxide layer 3 is a layered support structure 4 which is usually made from copper and is configured from the top of the silicon substrate layer 1 all the way up to the bottom of the bondpad 5. Such a configuration has been used to prevent failure of the oxide layer (fill material) 3.

The industry has long sought to incorporate protective structures over the semiconductor chip, or selective portions thereof, to minimize the impact of these forces on the chip structures. While the techniques described in the '917 patent are superior for the purposes for which it is designed; i.e., supporting structures to avoid failure in the fill material (low k material) during wirebonding, there remains a need to shield active chip devices from mechanical stresses, especially below the chip bondpads, where significant forces are applied resulting in increased mechanical stresses in those areas.

SUMMARY OF INVENTION

The invention provides a semiconductor structure comprising a substrate; a first layer adjacent to the substrate, the first layer comprising a first material having a first modulus of elasticity; a first structure comprising a conductor and formed within the substrate, the first structure having an upper surface and a lower surface; and a stress diverting structure proximate the first structure and within the first layer, wherein the stress diverting structure provides a low mechanical stress region at the upper surface of the first structure when a physical load is applied to the first structure. The stress diverting structure comprises a second material having a second modulus of elasticity less than the first modulus of elasticity, the second material selectively formed over the upper surface of the first structure for diverting mechanical stress created by the physical load applied to the first structure. Moreover, the stress diverting structure comprises a third material having a second modulus of elasticity greater than the first modulus of elasticity, the third material surroundingly encompassing the first structure for diverting mechanical stress created by the physical load applied to the first structure. Moreover, in one embodiment, the stress diverting structure is cubical. Furthermore, the low mechanical stress region comprises stress values at levels below the stress values in areas in the semiconductor structure unprotected by the stress diverting structure. Also, according to an embodiment of the invention, the first structure is formed adjacent to the first layer.

Additionally, the invention provides a semiconductor structure comprising a substrate; an active device region embedded within the substrate; a filler layer over the substrate, the filler layer comprising a material having a first modulus of elasticity; a bondpad over the filler layer, wherein the filler layer comprises a plurality of metal/via levels formed upwardly from the active device region to the bondpad; and a shield configured over the active device region and within the filler layer, wherein the shield comprises a material having a second modulus of elasticity different than the first modulus of elasticity, wherein the shield terminates at any of a first and second metal/via level above the substrate, wherein the shield provides a low mechanical stress region on the active device region when a physical load is applied to the bondpad above the active device region, and wherein the low mechanical stress region comprises stress values at levels below stress values in areas in the semiconductor structure unprotected by the shield. Moreover, in an embodiment of the invention, the shield comprises a material having a modulus of elasticity higher than the first modulus of elasticity. Additionally, in another embodiment of the invention, the shield comprises a material having a modulus of elasticity lower than the first modulus of elasticity.

Still in another embodiment of the invention, the shield comprises a first element having a modulus of elasticity higher than the first modulus of elasticity and a second element having a modulus of elasticity lower than the first modulus of elasticity. Furthermore, the invention provides an embodiment wherein the shield is cubical.

Another embodiment of the invention provides a method for forming a stress diverting semiconductor structure, wherein the method comprises forming a first layer adjacent to a substrate, whereby the first layer comprises a first material comprising a first modulus of elasticity; forming a first structure within the substrate, whereby the first structure comprises an upper surface and a lower surface; and forming a stress diverting structure proximate the first structure and within the first layer, wherein the stress diverting structure provides a low mechanical stress region at the upper surface of the first structure when a physical load is applied to the first structure. According to an embodiment of the invention, the first structure is formed adjacent to the first layer. Additionally, the low mechanical stress region comprises stress values at levels below stress values in areas in the semiconductor structure unprotected by the stress diverting structure.

The invention achieves several advantages, such as because the mechanical stresses are reduced in areas under the chip bondpad, the invention allows the semiconductor chip designer to include devices under the bondpad thereby increasing the effective usable area of the chip, which decreases the final chip size for a particular design. This significantly increases the number of chips per wafer, which consequently significantly reduces the manufacturing cost per chip. Furthermore, the ability to create structures to shield devices from excessive stresses in accordance with the invention allows the design of chips that are mechanically more robust than their traditional counterparts (when undergoing handling, probing, etc.). This allows for new possibilities for semiconductor applications that may require higher mechanical reliability. Moreover, the invention's approach to shield critical areas is not only applicable to shield active devices but can also be used to shield other features in a chip (critical metal line connections or vias, etc.).

These and other aspects and advantages of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As previously mentioned, there is a need to shield active chip devices from mechanical stresses, especially below the chip bondpads, where significant forces are applied resulting in increased mechanical stresses in those areas. Referring now to the drawings, and more particularly to FIGS. 2 through 13, there are shown preferred embodiments of the invention.

Generally, the invention provides an approach to the protection of individual devices or array of devices under wire bondpads by using a material having a lower modulus of elasticity compared to the surrounding dielectric material. Specifically, the invention reduces the stresses on active devices under bondpads by including supporting structures that divert the loads (forces) away from the devices and down to the bulk silicon, thereby diverting the mechanical stresses on the active devices.

Figure 2:
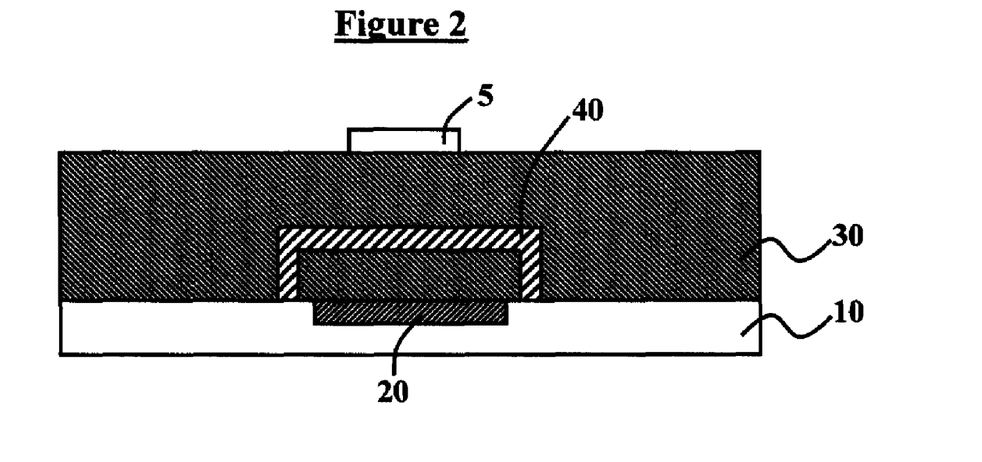
FIG. 2 is a schematic cross-sectional diagram of a semiconductor device according to an embodiment of the invention.
Figure 3:
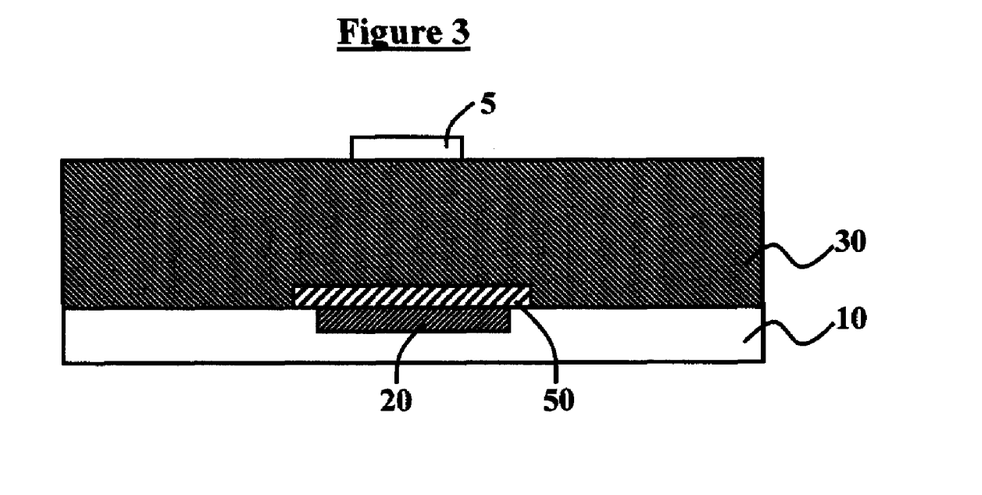
FIG. 3 is a schematic cross-sectional diagram of a semiconductor device according to a second embodiment of the invention.
Figure 4:
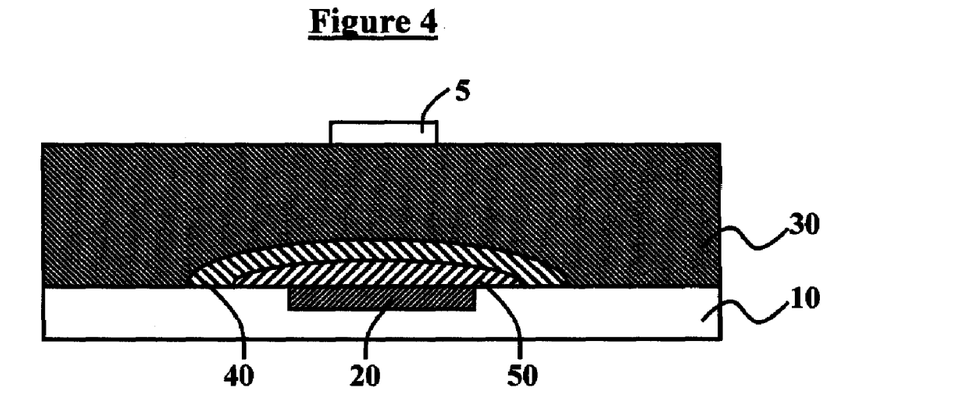
FIG. 4 is a schematic cross-sectional diagram of a semiconductor device according to a third embodiment of the invention.
Figure 10:
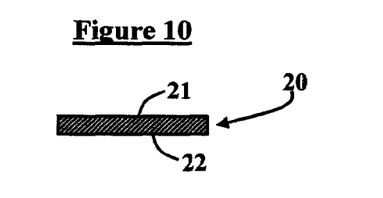
FIG. 10 is an isolated schematic cross-sectional diagram of the active device region of FIGS. 2–9, according to the invention.

According to a first embodiment illustrated in FIG. 2, the invention includes local stress shielding structures 40 that are dimensioned and configured within an oxide layer 30 to span only a few metal levels from the surface of the bulk silicon layer 10 and the active devices 20 included therein. The stress shielding structures 40 comprise material having a higher modulus of elasticity, E, than the oxide (fill) layer 30 material, and are placed over the active devices 20 to divert the load away from the device area 20 and down to the silicon 10 around it. Alternatively, as shown in FIG. 3, a material 50 comprising a lower modulus of elasticity, E, such as SILK® (or other materials exhibiting similar mechanical properties) is placed just above the device 20 to reduce the transmitted stress down to the device 20. In other words, the material 50 diverts the stress from the underlying device area 20 because the material 50 may comprise a softer material than the oxide layer 30, and may act as a stress absorber when compared to the oxide layer 30 alone. Additionally, a combination of both the first and second techniques is provided by the invention and illustrated in FIG. 4, wherein both a first material 40 having a high modulus of elasticity, E, and a second material 50 having a low modulus of elasticity, E, are placed over the device 20 to form the shielding structure. As shown in FIG. 4, the first and second materials 40, 50, respectively, are configured as generally semicircular shield structures, with the second material 50 configured adjacent to and over the active device 20, and the first material 40 configured over the second material 50. The active device 20 comprises an upper surface 21 and a lower surface 22, as further illustrated in FIG. 10. The semiconductor structure illustrated in FIG. 4 illustrates a semiconductor structure that provides a low mechanical stress region at the upper surface 21 of the active device region 20 when a physical load is applied to the region 40 above the active device region 20.

Figure 5:
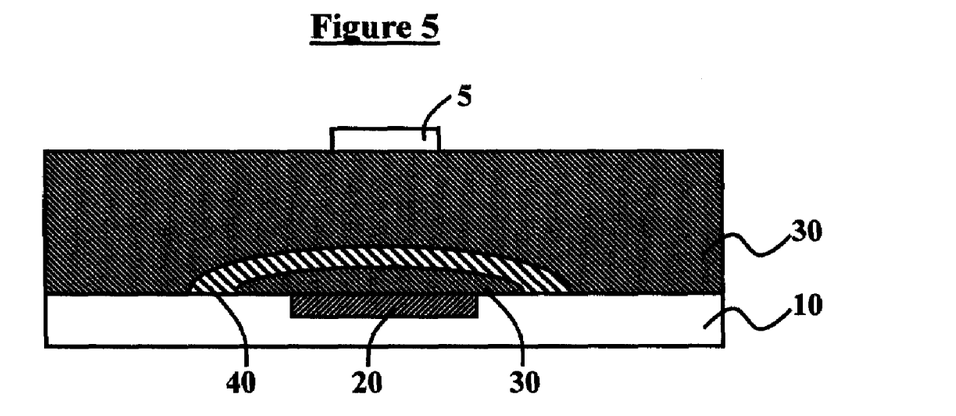
FIG. 5 is a schematic cross-sectional diagram of a semiconductor device according to a fourth embodiment of the invention.
Figure 6:
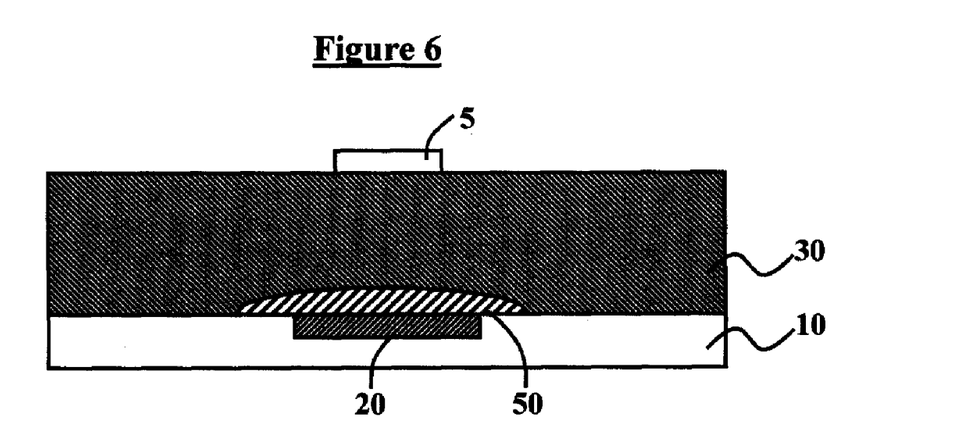
FIG. 6 is a schematic cross-sectional diagram of a semiconductor device according to a fifth embodiment of the invention.
Figure 7:
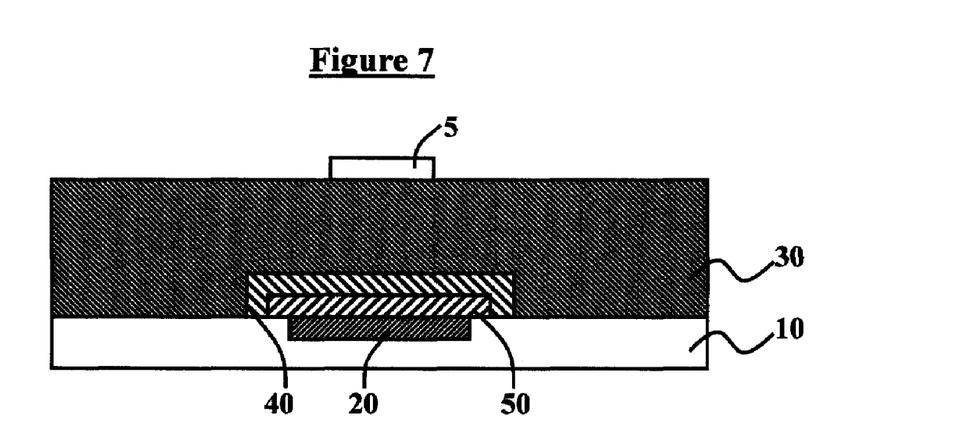
FIG. 7 is a schematic cross-sectional diagram of a semiconductor device according to a sixth embodiment of the invention.

FIGS. 5 through 7 illustrate further alternative embodiments according to the invention, wherein as shown in FIG. 5 (an alternative geometric embodiment to the device shown in FIG. 2), only a material 40 having a higher modulus of elasticity, E, is configured over the device. Here, the material 40 having a higher modulus of elasticity, E, compared to the fill material 30 is configured as a generally semicircular shield over the active device region 20. In FIG. 6 (an alternative geometric embodiment to the device shown in FIG. 3) a material 50 having a lower modulus of elasticity, E, compared to the fill material 30 is configured as a generally semicircular shield adjacent to and over the active device region 20. FIG. 7 (an alternative geometric embodiment to the device shown in FIG. 4) illustrates a first material 40 having a high modulus of elasticity, E, and a second material 50 having a low modulus of elasticity, E, being placed over the device 20 to form the shielding structure. As shown in FIG. 7, the first and second materials 40, 50, respectively, are configured as generally rectangular shield structures, with the second material 50 configured adjacent to and over the active device 20, and the first material 40 configured over the second material 50. Moreover, in the various embodiments described above the first material 40 and second material 50 selectively contact the underlying bulk silicon layer 10.

A finite element analysis (FEA) was performed to validate the concepts illustrated above. The results of the finite element analysis models validate the underlying concept provided by the invention, wherein the local shielding of active devices (in oxide technologies) from excessive stresses can be achieved by designing a structure with dissimilar material 40, 50 around the device 20 and up to the first metal levels M1 (or M2). As shown, one way to implement this idea is to place a rectangular volume of a material 50 of low E above the device 20. Such a material 50 can simply be low-k dielectric or a material with similar mechanical properties when compared to silicon dioxide as the filler material in area 30. Furthermore, because the volume of the material 50 is cubical in shape, the process lends itself easily to regular wafer manufacturing technology. As an example, the oxide layer 30 may comprise silicon dioxide having a modulus of elasticity E of approximately 66 GPa. First material 40 may comprise copper having a modulus of elasticity E of approximately 130 GPa. Moreover, second material 50 may comprise a low-k dielectric material having a modulus of elasticity E of approximately 15 GPa for chemical vapor deposition (CVD) processes or down to less than 5 GPa for SILK®. In general, the higher the difference between the E of oxide layer 30 and first material 40, and the oxide layer 30 and second material 50, the better the stress shielding effect.

Additionally, within the testing validated by the finite element analysis, different geometries were modeled and the results showed that an area of low E material 50 such as low-k dielectric immediately above the region of interest 20 reduces the principal and equivalent structural stresses in the region 20. The extent of the stress reduction is dependent on the material properties, the geometry of the shielding structure, and the loading conditions. Simulations performed for different shield shapes and designs show a reduction in stress ranging from 14% in some areas and up to 50% in others. For a shield structure such as the one depicted in the embodiment shown in FIG. 3, a plot of the equivalent stress plotted along the surface of the active device region would look like the plot illustrated in FIG. 12. The stress values without a shielding structure would be approximately 72 MPa, whereas in the presence of the inventive structure, the stress values would drop to approximately 55–60 MPa over most of the region of interest and would drop even further over the remaining regions.

The low E area 50 should preferably be dimensioned either as wide as possible to allow the inclusion of the device 20 underneath it or dimensioned having as low of a height as possible from a manufacturability standpoint so that it encompasses as few layers as possible (M1 (metal line 1),V1 (via 1), . . . , etc). It is advantageous to have the structural shield encompass as few metal and via levels as possible in order to give freedom for the chip designer to layout electrical wiring and connections without spatial constraints. Furthermore, the finite element analysis simulations demonstrate that stress reduction is achieved at different aspect ratios. (e.g., for an aspect ratio of 1:1 (i.e., width=height) and 3:1 (i.e., width=3×height)).

Additionally, further simulations were performed to address the challenge of connecting the devices under the low E region 50 to the metal wiring above (e.g., M1). According to the finite element analysis simulations, the stress concentration tends to occur at the base(s) of vias for regular oxide technologies (i.e., in the absence of shielding structures such as the ones provided by the invention). The stress concentration at the vias was also demonstrated when the via and the metal line fell within a low E region 50.

Figure 8:
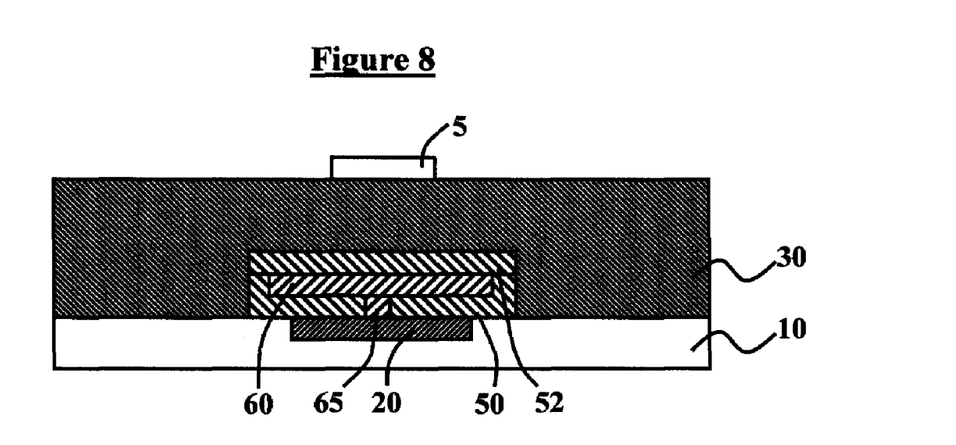
FIG. 8 is a schematic cross-sectional diagram of a semiconductor device according to a seventh embodiment of the invention.
Figure 9:
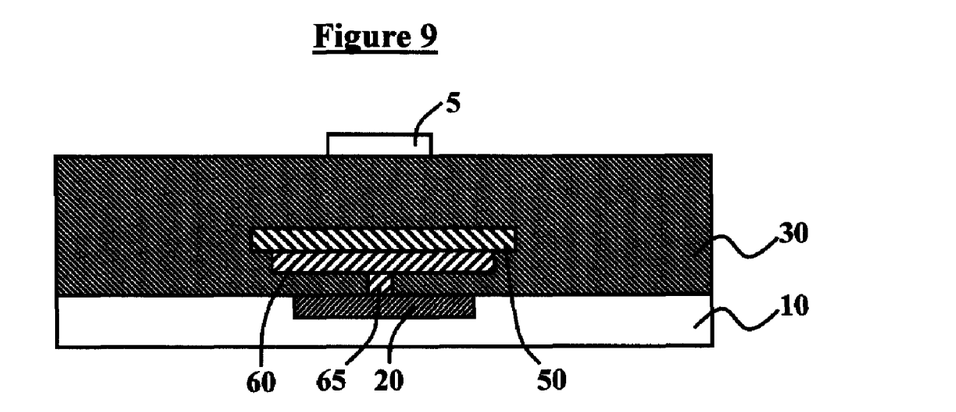
FIG. 9 is a schematic cross-sectional diagram of a semiconductor device according to an eighth embodiment of the invention.

According to a second finite element analysis simulation conducted to validate the concepts provided by the invention, connecting the device 20 by a via 65 up to a first metal layer 60 (M1), which may be approximately 2 µm in width, such as illustrated in FIG. 8, creates additional options as to what material may be used for the shielding structures. For example, FIGS. 8 and 9 illustrate semiconductor devices which are alternatives to the embodiment provided in FIG. 3, wherein the low E material 50 borders the via 65 and the metal wiring (line) 60. As shown, these embodiments may assume several configurations, some of which are provided in FIGS. 8 and 9. In the device shown in FIG. 8, an additional low E layer 52 aids in reducing the stress on the device 20. In the device shown in FIG. 9, the low E layer 50 is configured over the metal line 60, thereby aiding in reducing the stress on the device 20.

Figure 11:
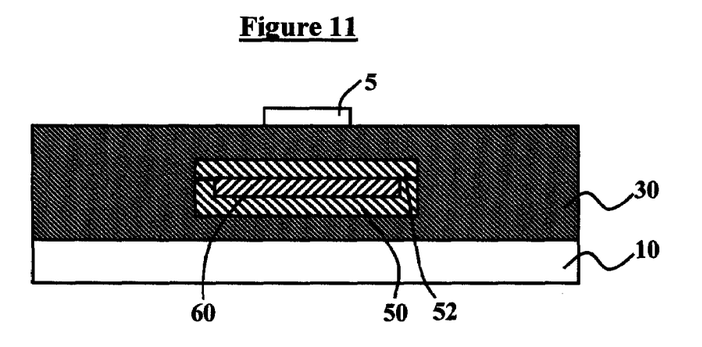
FIG. 11 is a schematic cross-sectional diagram of a semiconductor device according to a ninth embodiment of the invention.

Another embodiment of the invention is illustrated in FIG. 11. In the device shown in FIG. 11, the first low E layer 50 and second low E layer 52 are configured around the metal line 60, which are configured within the oxide layer 30. As shown, this configuration does not require that the either the first low E layer 50 or second low E layer 52 be adjacent to the substrate 10. According to this embodiment, the shields 50, 52 serve to divert and/or reduce the stresses on the metal line 60, which is below the bondpad 5.

Figure 12:
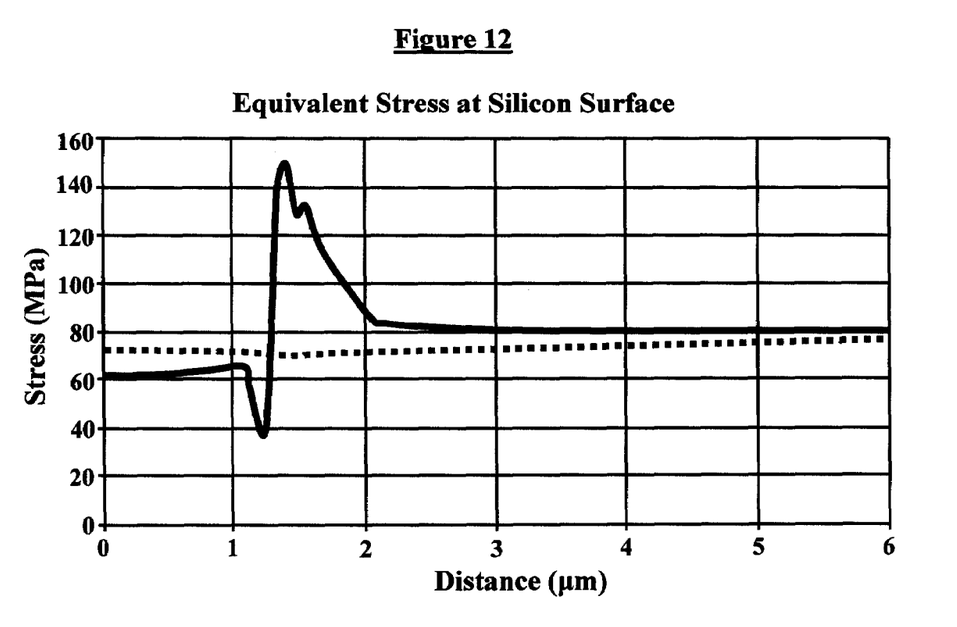
FIG. 12 is a graphical representation comparing results achieved by the invention compared to conventional devices.

In the graph shown in FIG. 12, the equivalent stress at the surface of the silicon layer 20 is depicted for a conventional semiconductor device shown as the dotted line plot, and for a semiconductor device provided by the invention (a structure with dissimilar material 40, 50 around the device 20) shown as the full line plot. The stress observed at the surface of the silicon 20 for the inventive structure is found to be 14–50% below (i.e., stress reduction) the stress in the conventional structures, or in other words, the stress values observed for areas shielded by the shielding structure 40, 50 is found to be at least 14% below the stress observed in un-shielded areas, given that the same load is applied to the entire surface/device. The stress reduction below the shielding structure is achieved at the expense of a stress increase outside the shielded area. This is an acceptable compromise because the region of interest (to be populated with active devices) is below the shielded area and the region beyond the shielded area is the surface of the silicon substrate and hence there is no adverse effect to the stress increase there. In FIG. 12, the region with the lower stress is the shielded area and the region of higher stress falls outside the shielded area.

The invention relates to a method and structure for reducing the mechanical stresses on semiconductor chip devices which are located under wire bondpads 5. According to an embodiment of the invention, a material 40 with a higher modulus of elasticity compared to a bulk dielectric 30 is combined with a material 50 with a lower modulus of elasticity compared to the bulk dielectric 30 in order to reduce the stress on the device 20 under the bond-pad 5.

Figure 13:
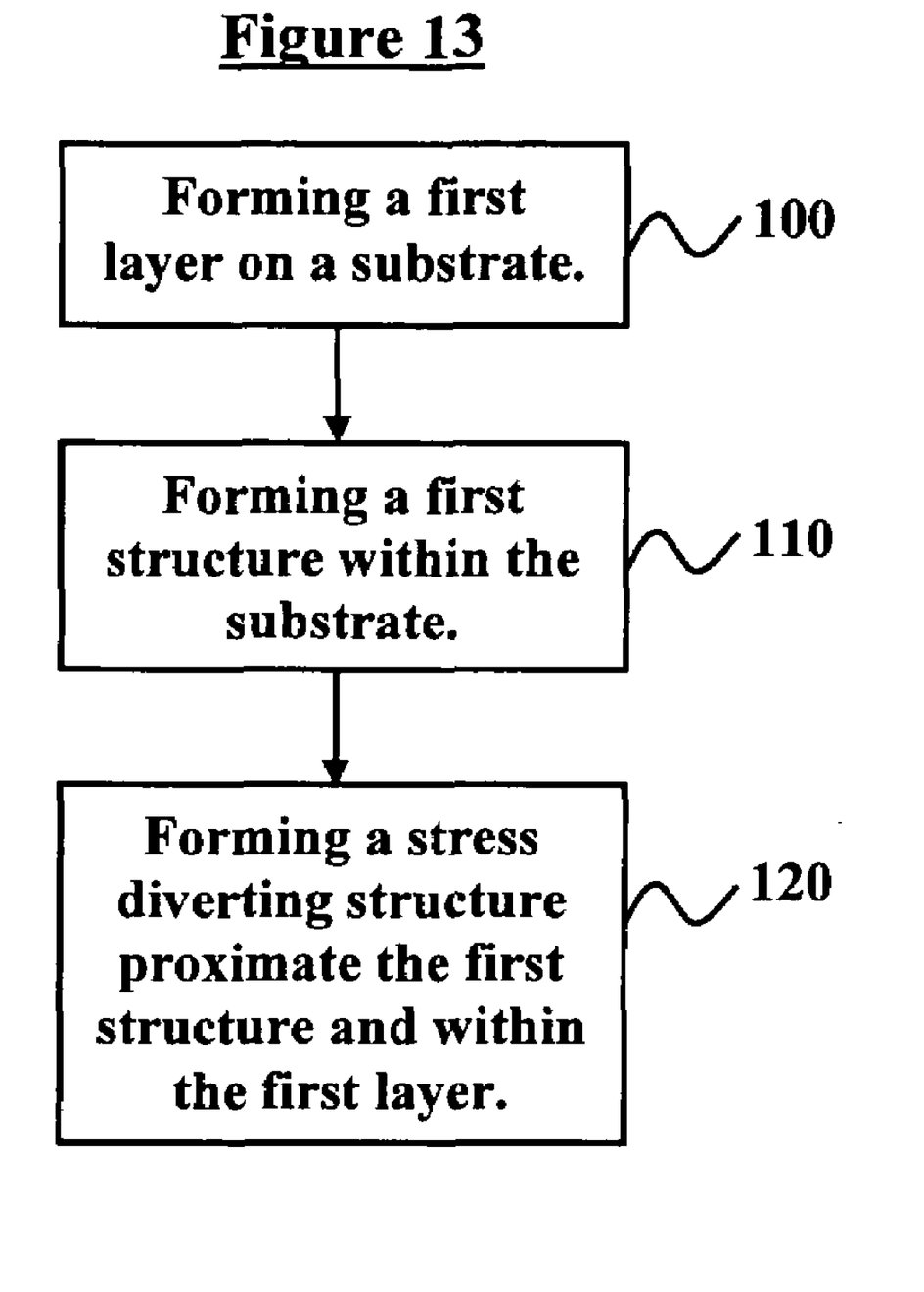
FIG. 13 is a flow diagram illustrating a preferred method of the invention.

A method of forming a stress diverting semiconductor structure of the invention is shown in the flow diagram of FIG. 13. The method comprises forming 100 a first layer 30 over a substrate 10, wherein the first layer 30 comprises a first material comprising a first modulus of elasticity. Next, a first structure 20 is formed 110 within the substrate 10, wherein the first structure 20 comprises an upper surface 21 and a lower surface 22. According to an embodiment of the invention, the first structure 20 is formed adjacent to the first layer 30. Then, a stress diverting structure 40, 50 is formed 120 proximate to the first structure 20 and within the first layer 30, wherein the stress diverting structure 40, 50 provides a low mechanical stress region at the upper surface 21 of the first structure 20 when a physical load is applied to the first structure 20.

Accordingly, the semiconductor structure provided by the invention comprises a substrate 10; an active device region 20 embedded within the substrate 10; a filler layer 30 over the substrate 10, wherein the filler layer 30 comprises a material having a first modulus of elasticity; a bondpad 5 over the filler layer 30, wherein the filler layer 30 comprises a plurality of metal/via levels 60, 65 formed upwardly from the active device region 20 to the bondpad 5; and a shield 40, 50 configured over the active device region 20 and within the filler layer 30, wherein the shield 40, 50 comprises a material having a second modulus of elasticity different than the first modulus of elasticity, wherein the shield 40, 50 terminates at any of a first and second metal/via level 60, 65 above the substrate 10, and wherein the shield 40, 50 provides a low mechanical stress region at the upper surface 21 of the active device region 20 when a physical load is applied to the bondpad 5, which is therein translated to the active device region 20. Moreover, in an embodiment of the invention, the shielding structure comprises a material 40 having a modulus of elasticity higher than the first modulus of elasticity. Additionally, in another embodiment of the invention, the shielding structure comprises a material 50 having a modulus of elasticity lower than the first modulus of elasticity. Accordingly, those skilled in the art would understand that the invention may be incorporated in an integrated circuit device, wherein logic circuitry (not shown) may be configured to the substrate 10.

The invention achieves several advantages. For example, because the mechanical stresses are reduced in areas under the chip bondpad 5, the invention allows the semiconductor chip designer to include devices 20 under the bondpad 5 thereby increasing the effective usable area of the chip, which decreases the final chip size for a particular design. This significantly increases the number of chips per wafer, which consequently significantly reduces the manufacturing cost per chip. Furthermore, the ability to create structures to shield devices from excessive stresses in accordance with the invention allows the design of chips that are mechanically more robust than their traditional counterparts (when undergoing handling, probing, etc.). This allows for new possibilities for semiconductor applications that may require higher mechanical reliability. Moreover, the invention's approach to shield critical areas is not only applicable to shield active devices but can also be used to shield other features in a chip (critical metal line connections or vias, etc.).

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A semiconductor structure comprising:
   a substrate;
   a first layer over said substrate, said first layer comprising a first material having a first modulus of elasticity;
   a first structure formed within said first layer, said first structure having an upper surface; and
   a stress diverting structure proximate said first structure wherein said stress diverting structure provides a low mechanical stress region at said upper surface of said first structure when a physical load is applied to said first structure,
   wherein said stress diverting structure comprises a second material having a second modulus of elasticity greater than said first modulus of elasticity, said second material surroundingly encompassing said first structure for diverting mechanical stress created by said physical load applied to said first structure.

2. A method for forming a stress diverting semiconductor structure, said method comprising:
   forming a first layer adjacent to a substrate, said first layer comprising a first material comprising a first modulus of elasticity;
   forming a first structure within said first layer, said first structure comprising an upper surface; and
   forming a stress diverting structure proximate said first structure, wherein said stress diverting structure provides a low mechanical stress region at said upper surface of said first structure when a physical load is applied to said first structure,
   wherein said forming of said stress diverting structure comprises selectively forming a second material comprising a second modulus of elasticity less than said first modulus of elasticity over said upper surface of said first structure for diverting mechanical stress created by said physical load applied to said first structure, and wherein said forming of said stress diverting structure comprises surroundingly encompassing a third material comprising a third modulus of elasticity greater than said first modulus of elasticity around said first structure for diverting mechanical stress created by said physical load applied to said first structure.

* * * * *